US010891186B2

(12) United States Patent
Kawanishi et al.

(10) Patent No.: US 10,891,186 B2
(45) Date of Patent: Jan. 12, 2021

(54) SEMICONDUCTOR DEVICE AND SEMICONDUCTOR SYSTEM INCLUDING THE SAME

(71) Applicant: Renesas Electronics Corporation, Tokyo (JP)

(72) Inventors: Toru Kawanishi, Tokyo (JP); Tadashi Teranuma, Tokyo (JP); Masaaki Hirano, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 139 days.

(21) Appl. No.: 16/116,650

(22) Filed: Aug. 29, 2018

(65) Prior Publication Data

US 2019/0138389 A1     May 9, 2019

(30) Foreign Application Priority Data

Nov. 7, 2017   (JP) ................................ 2017-214727

(51) Int. Cl.
  *G06F 11/10*     (2006.01)
  *H03M 13/09*     (2006.01)
  (Continued)

(52) U.S. Cl.
  CPC ...... *G06F 11/1044* (2013.01); *G06F 11/1072* (2013.01); *G06F 13/4027* (2013.01);
  (Continued)

(58) Field of Classification Search
  None
  See application file for complete search history.

(56) References Cited

U.S. PATENT DOCUMENTS 5,396,504 A * 3/1995 Pack ..................... H04N 5/945
                                                       714/755
5,694,405 A * 12/1997 Kuwahara ............. H04L 1/0057
                                                       714/752
(Continued)

FOREIGN PATENT DOCUMENTS

EP      2 180 600 A1     4/2010
JP      2009-282849 A    12/2009

OTHER PUBLICATIONS

Yuan et al., Reliability-Based ECC System for Adaptive Protection of NAND Flash Memories, IEEE, Conference Paper, pp. 897-902 (Year: 2015).*

(Continued)

*Primary Examiner* — April Y Blair
*Assistant Examiner* — Dipakkumar B Gandhi
(74) *Attorney, Agent, or Firm* — McDermott Will & Emery LLP

(57) ABSTRACT

According to one embodiment, a semiconductor device includes an ECC decoder which performs diagnosis on data using an error detection code for the data, an ECC encoder which generates an error detection code for a first data piece equivalent to a bit range accounting for a part of plural bits configuring the data and generates an error detection code for a second data piece equivalent to a bit range accounting for a remaining part of the bits, and a diagnosis circuit which, when no error in the data has been detected by the ECC decoder, compares a part of the data corresponding to the first data piece with the first data piece used in generating the first error detection code and compares a part of the data corresponding to the second data piece with the second data piece used in generating the second error detection code.

10 Claims, 4 Drawing Sheets

(51) Int. Cl.
  H03M 13/00    (2006.01)
  H04L 1/00     (2006.01)
  H03M 13/37    (2006.01)
  G06F 13/40    (2006.01)
  H03M 13/05    (2006.01)
  G06F 11/22    (2006.01)

(52) U.S. Cl.
  CPC ........... H03M 13/05 (2013.01); H03M 13/09 (2013.01); H03M 13/3776 (2013.01); H03M 13/6502 (2013.01); H04L 1/0045 (2013.01); H04L 1/0061 (2013.01)

(56) References Cited

U.S. PATENT DOCUMENTS

| | | | | |
|---|---|---|---|---|
| 7,865,809 | B1* | 1/2011 | Lee | H03M 13/1535 714/782 |
| 8,887,032 | B1* | 11/2014 | Varnica | H03M 13/1111 714/780 |
| 2001/0000959 | A1* | 5/2001 | Campana, Jr. | G08B 21/0222 340/573.1 |
| 2002/0046366 | A1 | 4/2002 | Ono | |
| 2003/0002184 | A1* | 1/2003 | Hayami | H03M 5/145 360/29 |
| 2004/0139269 | A1 | 7/2004 | Nakamura | |
| 2006/0209813 | A1* | 9/2006 | Higuchi | H04L 1/0003 370/366 |
| 2008/0163033 | A1* | 7/2008 | Yim | H03M 13/3715 714/785 |
| 2009/0125787 | A1* | 5/2009 | Sakimura | G06F 11/1044 714/764 |
| 2010/0192048 | A1* | 7/2010 | Washio | H04L 1/0061 714/799 |
| 2013/0198587 | A1* | 8/2013 | Kim | G06F 11/1048 714/763 |
| 2014/0140359 | A1* | 5/2014 | Kalevo | H04L 69/04 370/474 |
| 2017/0063394 | A1* | 3/2017 | Halbert | G06F 11/1068 |

OTHER PUBLICATIONS

PCI-X Protocol Addendum to the PCI Local Bus Specification Revision 2.0, XP007912529, Jul. 29, 2002, PCI-SIG.
Extended European Search Report dated Feb. 14, 2019 for European Patent Application No. 18194548.6-1210.

* cited by examiner

SEMICONDUCTOR DEVICE AND SEMICONDUCTOR SYSTEM INCLUDING THE SAME

CROSS-REFERENCE TO RELATED APPLICATIONS

The disclosure of Japanese Patent Application No. 2017-214727 filed on Nov. 7, 2017 including the specification, drawings and abstract is incorporated herein by reference in its entirety.

BACKGROUND

The present invention relates to a semiconductor device and a semiconductor system including same and pertains to a semiconductor device and a semiconductor system including the same which are, for example, suitable for improving a fault detection rate, while restraining enlargement of circuit size.

A bus bridge for transporting data between buses changes bit width of data before and after transportation when transporting data between buses having different width widths. Now, because changing bit width of data involves changing bit width of its Error Correction Code (ECC), it is required to replace the ECC attached to data by a suitable ECC before and after transportation. During the ECC replacement, it is impossible to perform error detection using ECC and, therefore, such bus bridge has encountered a problem of decrease in a fault detection rate.

A solution to this problem is disclosed in Patent Document 1. Duplicated interface circuits are employed in a configuration disclosed in Patent Document 1. By comparing respective output results of two interface circuits, error detection is performed for data during an interfacing operation, thus improving a fault detection rate.

RELATED ART DOCUMENT

Patent Document

[Patent Document 1]
Japanese Unexamined Patent Application Publication No. 2009-282849

SUMMARY

In the configuration of Patent Document 1, however, because duplicated interface circuits (bus bridges) are employed, a problem in which circuit size is enlarged has been posed. Other problems and novel features will become apparent from the description in the present specification and the accompanying drawings.

According to one embodiment, a semiconductor device includes an ECC (Error Correction Code) decoder which diagnoses whether or not an error occurs in data transmitted from a transmitting circuit, using an error detection code for that data, an ECC encoder which generates a first error detection code for a first divided piece of data equivalent to a bit range accounting for a part of plural bits configuring the data and generates a second error detection code for a second divided piece of data equivalent to a bit range accounting for a remaining part of the bits configuring the data, and a diagnosis circuit which, when no error in the data has been detected by the ECC decoder, compares a part of the data corresponding to the first divided piece of data with the first divided piece of data used in generating the first error detection code in the ECC encoder and compares a part of the data corresponding to the second divided piece of data with the second divided piece of data used in generating the second error detection code in the ECC encoder.

According to one embodiment, a semiconductor device includes an ECC (Error Correction Code) decoder which diagnoses whether or not an error occurs in data transmitted from a transmitting circuit, using an error detection code for that data, an ECC encoder which generates a first error detection code for a first divided piece of data equivalent to a bit range accounting for a part of plural bits configuring the data and generates a second error detection code for a second divided piece of data equivalent to a bit range accounting for a remaining part of the bits configuring the data, and an diagnosis circuit which diagnoses whether or not an error occurs in each of the first divided piece of data used in generating the first error detection code in the ECC encoder and the second divided piece of data used in generating the second error detection code in the ECC encoder, using the error detection code for the data.

According to the foregoing one embodiment, it is possible to provide a semiconductor device and a semiconductor system including the same which enable it to improve a fault detection rate, while restraining enlargement of circuit size.

DETAILED DESCRIPTION

Figure 1:
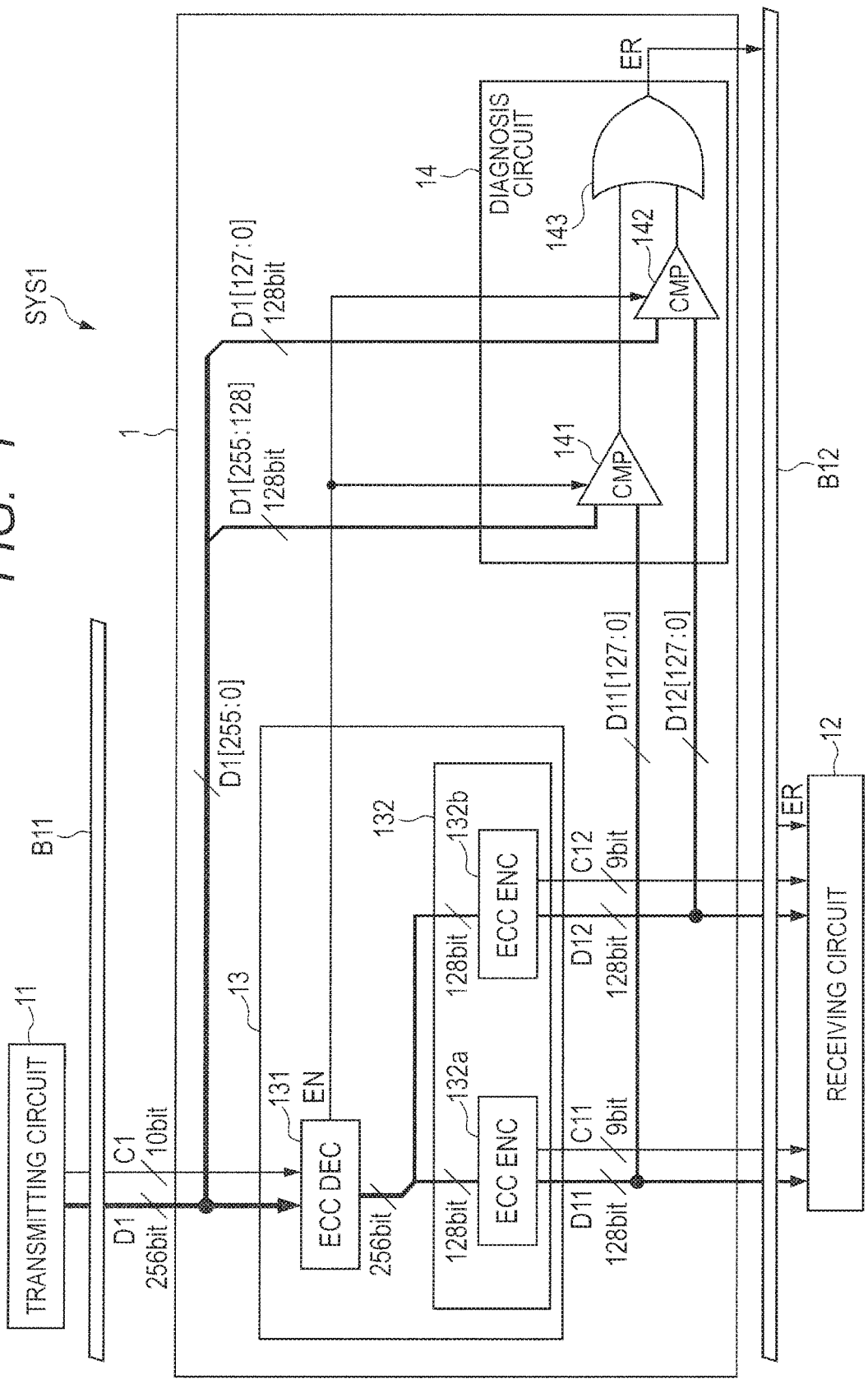
FIG. 1 is a diagram depicting a configuration example of a semiconductor system pertaining to a first embodiment.

For clarity of description, abbreviation and simplification are made, where appropriate, in the following descriptions and accompanying drawings. Besides, all elements which are described in the drawings as functional blocks to perform various processing tasks can be configured, in a hardware aspect, with a CPU a memory, and other circuits and they are implemented, in a software aspect, with programs or the like which have been loaded into a memory. Therefore, it will be understood by those skilled in the art that these functional blocks can be implemented in various ways, i.e., by only hardware, only software, or hardware/software combination and their implementation is not limited to any one way. And now, identical elements are assigned identical reference designators across all the drawings and duplicative descriptions are omitted, as appropriate.

Besides, the foregoing programs may be stored using various types of non-transitory computer readable media and can be supplied to a computer. The non-transitory computer readable media include various types of tangible storage media. Examples of the non-transitory computer readable media include, a magnetic recording medium (e.g., a flexible disk, a magnetic tape, or a hard disk drive), a magneto-optical recording medium (e.g., a magneto-optical disk), a CD-ROM (Read Only Memory), CD-R, CD-R/W, and a semiconductor memory (e.g., mask ROM, PROM (Programmable ROM), EPROM (Erasable PROM), flash ROM, or RAM (Random Access Memory)). The programs may also be supplied to a computer through various types of transitory computer readable media. Examples of the transitory computer readable media include an electric signal, optical signal, and electromagnetic wave. The transitory computer readable media can supply the programs to a computer via a wired communication path such as an electric wire and an optical fiber or via a wireless communication path.

First Embodiment

FIG. 1 is a diagram depicting a configuration example of a semiconductor system SYS1 pertaining to a first embodiment. When no error is present in data D1 before being transported by a bus bridge, the semiconductor system SYS1 pertaining to the present embodiment makes a comparison between data D1 before being transported and divided pieces of data D11 and D12 after being transported and diagnoses whether or not an error occurs in data under transportation. Thereby, the semiconductor system SYS1 pertaining to the present embodiment enables it to improve a fault detection rate, while restraining enlargement of circuit size, as compared with a case where duplicated bus bridges are simply employed. This will be explained below specifically.

As depicted in FIG. 1, the semiconductor system SYS1 includes a transmitting circuit 11, a receiving circuit 12, a bus B11, a bus B12, a bus bridge 13, and a diagnosis circuit 14. And now, a semiconductor device 1 is comprised of the bus bridge 13 and the diagnosis circuit 14.

The transmitting circuit 11 is a circuit to transmit data D1 and its error detection code C1. The transmitting circuit 11 is, for example, a memory and outputs data D1 and its error detection code C1, stored in a storage area of the memory, in read mode. The data D1 and its error detection code C1 are supplied to the bus B11.

In the present embodiment, as an example, a case is described where data D1 has a bit width of 256 bits and its error detection code C1 has a bit width of 10 bits. And now, a notation, data D1 [a:b] denotes data with a width of a−b+1, which is equivalent to a bit range from the a-th bit to the b-th bit in data D1 (where a≥b and both a and b are integers).

The bus bridge 13 performs transportation of data between the buses B11 and B12. For instance, the bus bridge 13 divides 256-bit wide data D1 supplied from the transmitting circuit 11 via the bus B11 into 128-bit wide pieces of data D11 and D12 which are fit for the bus width of the bus B12 and outputs these pieces of data sequentially to the bus B12. Also, the bus bridge 13 performs error detection for the data D1 using the error detection code C1 (and makes a correction, if possible) and, besides, generates 9-bit wide error detection codes C11 and C12 for each of the 128-bit wide pieces of data D11 and D12 and outputs these codes together with the data D11 and D12 to the bus B12.

In the present embodiment, as an example, a case is described where data D11 corresponds to 128-bit wide data which is equivalent to high-order 128 bits in data D1 (i.e., data D1 [255:128]) and data D12 corresponds to 128-bit wide data which is equivalent to low-order 128 bits in data D1 (i.e., data D1 [127:0]).

Specifically, the bus bridge 13 includes an ECC decoder 131 and an ECC encoder 132. The ECC encoder 132 includes an ECC encoder 132a and an ECC encoder 132b. And now, either of the ECC encoders 132a and 132b may be used as a single common ECC encoder.

Using the error detection code C1 for data D1 transmitted from the transmitting circuit 11, the ECC decoder 131 diagnoses whether or not an error occurs in the data D1. For instance, if no error occurs in the data D1, the ECC decoder 131 outputs the data D1 as it is and sets an enable signal EN active (at H level). Otherwise, if an error occurs in the data D1, the ECC decoder 131 corrects the data D1 and then outputs it and, besides, sets the enable signal EN inactive (at L level). And now, if it is impossible to correct the data D1, the enable signal EN is fixed in an inactive state.

The ECC encoder 132a generates a 9-bit wide error detection code C11 for the 128-bit wide data D11 which is equivalent to the high-order 128 bits in the data D1. The ECC encoder 132b generates a 9-bit wide error detection code C12 for the 128-bit wide data D12 which is equivalent to the low-order 128 bits in the data D1. A combination of the data D11 and its error detection code C11 as well as a combination of the data D12 and its error detection code C12 are output sequentially to the bus B12.

The receiving circuit 12 is a circuit to receive data D11 and D12 and their error detection codes C11 and C12 supplied to the bus B12. The receiving circuit 12 is, for example, a Central Processing Unit (CPU) and receives the divided pieces of data D11 and D12 of data D1 transmitted from the transmitting circuit 11 and their error detection codes C11 and C12.

The diagnosis circuit 14 diagnoses whether or not an error occurs in data being transported by the bus bridge 13, only when no error occurs in the data D1 before being transported by the bus bridge 13 (when the enable signal EN is active). For instance, if an error occurs in the data under transportation, the diagnosis circuit 14 sets an error detection signal active (at H level); if not so, the diagnosis circuit sets the error detection signal inactive (at L level).

Specifically, the diagnosis circuit 14 includes a comparator 141, a comparator 142, and a logical sum circuit (hereinafter referred to as an OR circuit) 143.

The comparator 141 is driven only when the enable signal EN is active and compares the high-order 128 bits in the data D1 (i.e., data D1 [255:128]) with the 128-bit wide data D11 used in generating the error detection code C11. For instance, if there is a match between the data D1 [255:128] and the data D11, the comparator 141 keeps a comparison result inactive (at L level); if there is a mismatch, the comparator sets the comparison result active (at H level).

The comparator 142 is driven only when the enable signal EN is active and compares the low-order 128 bits in the data D1 (i.e., data D1 [127:0]) with the 128-bit wide data D12 used in generating the error detection code C12. For instance, if there is a match between the data D1 [127:0] and the data D12, the comparator 142 keeps a comparison result inactive (at L level); if there is a mismatch, the comparator sets the comparison result active (at H level).

The OR circuit 145 outputs a logical sum of comparison results respectively output by the comparators 141 and 142 as an error detection signal ER. For instance, if both the comparison results output by the comparators 141 and 142 indicate data match, the OR circuit 145 sets the error detection signal ER inactive (at L level); if either of the comparison results output by the comparators 141 and 142 indicates data mismatch, the OR circuit sets the error detection signal ER active (at H level).

As will be appreciated from the foregoing, the semiconductor system SYS1 pertaining to the present embodiment makes a comparison between the data D1 before being transported and the divided pieces of data D11 and D12 after being transported and diagnoses whether or not an error occurs in the data under transportation, only when no error exists in the data D1 before being transported by the bus bridge 13. Thereby, the semiconductor system SYS1 pertaining to the present embodiment enables it to improve a fault detection rate, while restraining enlargement of circuit size, as compared with a case where duplicated bus bridges are simply employed. Because enlargement of circuit size can be restrained, it is possible to allow enough room for circuit layout and signal line wiring and, consequently, it is possible to facilitate designing to fulfill timing constraints.

In the present embodiment, as an example, a case where the bus bridge 13 divides data D1 into two 128-bit wide pieces of data D11 and D12 was described; however, no limitation to this is intended. The bus bridge 13 can be modified, as appropriate, to a configuration such that the bus bridge 13 divides data D1 into three or more pieces of data.

Besides, the configuration of the semiconductor device 1 which is comprised of the bus bridge 13 and the diagnosis circuit 14 is not limited to the configuration depicted in FIG. 1 and can be modified, as appropriate, without departing from the spirit of the invention. Another concrete example of the configuration of the semiconductor device 1 is described below with the aid of FIG. 2.

[Another Concrete Example of the Configuration of the Semiconductor Device 1]

Figure 2:
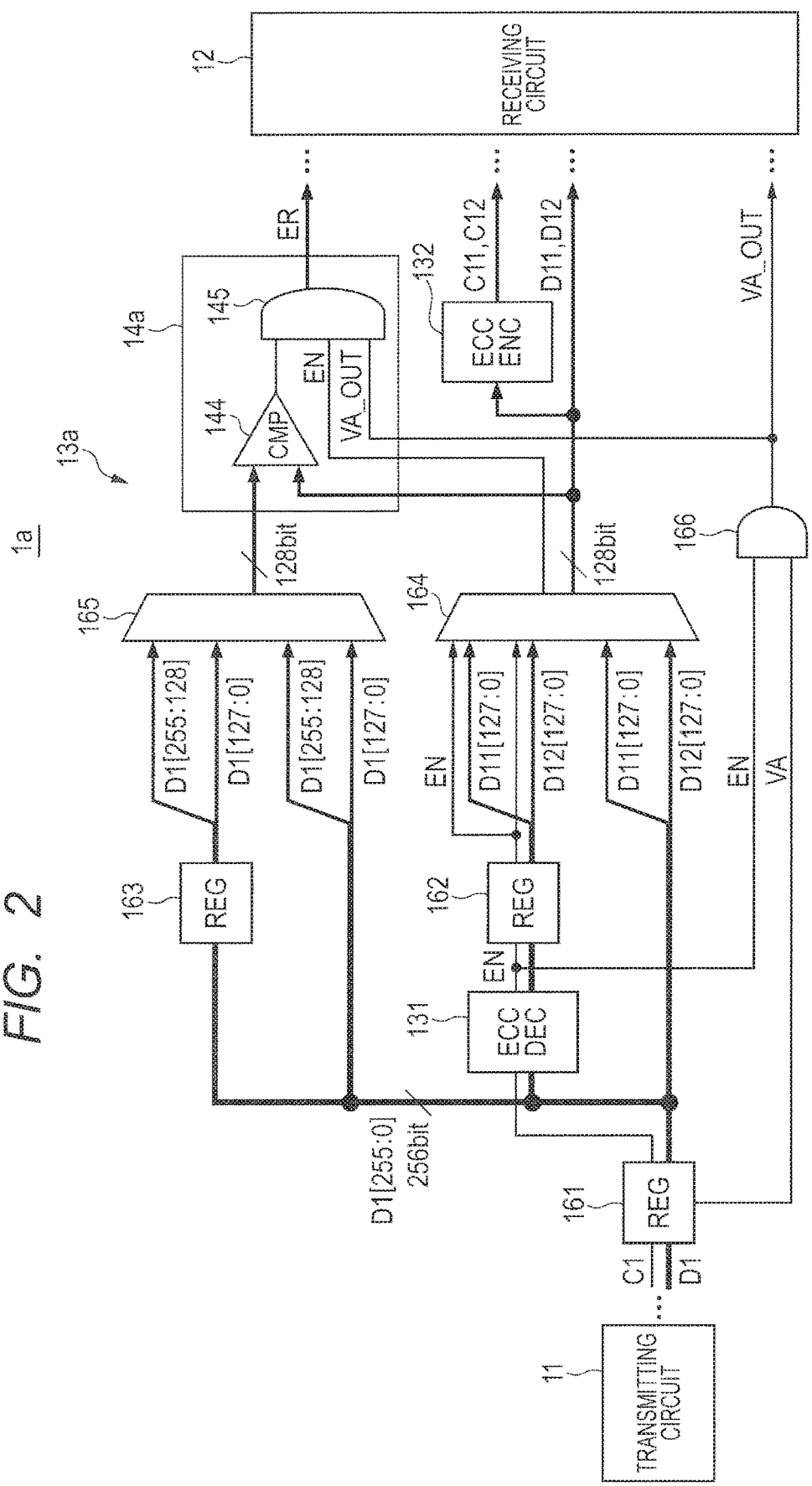
FIG. 2 is a diagram depicting another concrete example of a semiconductor device provided in the semiconductor system.

FIG. 2 is a diagram depicting another concrete example of the configuration of the semiconductor 1 as a semiconductor device 1a. And now, the transmitting circuit 11 and the receiving circuit 12 are also presented in FIG. 2. For the semiconductor device 1a, its components which are the same as those of the semiconductor device 1 are assigned the same reference designators.

As depicted in FIG. 2, the semiconductor device 1a further includes registers 161 to 163, selectors 164 and 165, and a valid signal output unit 166, in addition to the ECC decoder 131, ECC encoder 132, and a diagnosis circuit 14a which corresponds to the diagnosis circuit 14. And now, a bus bridge 13a is comprised of the components of the semiconductor device 1a with the exception of the diagnosis circuit 14a.

A register 161 takes in data D1 and its error detection code C1 from the transmitting circuit 11 in sync with a clock signal. Upon taking in the data D1 and error detection code C1 normally, the register 161 sets a valid signal VA active (at H level).

Using the error detection code C1 taken in by the register 161, the ECC decoder 131 diagnoses whether or not an error occurs in the data D1 taken in by the register 161. For instance, if no error occurs in the data D1, the ECC decoder 131 outputs the data D1 as it is and sets the enable signal EN active (at H level). Otherwise, if an error occurs in the data D1, the ECC decoder 131 corrects the data D1 and then outputs it and, besides, sets the enable signal EN inactive (at L level). And now, if it is impossible to correct the data D1, the enable signal EN is fixed in an inactive state.

The valid signal output unit 166 is, for example, a logical multiplication circuit (AND circuit) and outputs a product of logically multiplying a valid signal VA and an enable signal EN together as a valid signal VA_OUT. For instance, if both the valid signal VA and the enable signal EN are active, the valid signal output unit 166 sets the valid signal VA_OUT active (at H level); if either of these two signals is inactive, this unit sets the valid signal VA_OUT inactive (at L level).

And now, if the valid signal VA_OUT is active, the receiving circuit 12 determines that data D11 and D12 received from the bus bridge 13a are valid; if the valid signal VA_OUT is inactive, the receiving circuit 12 determines that data D11 and D12 received from the bus bridge 13a are invalid.

A register 162 takes in data D1 for which no correction is needed or corrected data D1 and an enable signal EN, which have been output from the ECC decoder 131, in sync with a clock signal. At the same time, a register 163 takes in the data D1 which was taken in by the register 161 in sync with a clock signal.

A selector 164 selectively outputs either data D11 and data D12 generated by dividing the corrected data D1 which was taken in by the register 162 into two pieces of data or data D11 and data D12 generated by dividing the data D1 which was taken in by the register 161 into two pieces of data.

A selector 165 selectively outputs either data D1 [255:128] composed of high-order 128 bits and data D1 [127:0] composed of low-order 128 bits in the data D1 which was taken in by the register 163 or data D1 [255:128] composed of high-order 128 bits and data D1 [127:0] composed of low-order 128 bits in the data D1 which was taken in by the register 161.

The ECC encoder 132 generates 9-bit wide error detection codes C11 and C12 for the 128-bits wide data D11 and D12 which are output sequentially from the selector 164.

The diagnosis circuit 14a diagnoses whether or not an error occurs in the data being transported by the bus bridge 13a, only when the enable signal EN is active.

Specifically, the diagnosis circuit 14a includes a comparator 144 and a logical multiplication circuit (hereinafter referred to as an AND circuit) 145. The comparator 144 compares both data respectively output by the selectors 164 and 165. For instance, if there is a match between both the data respectively output by the selectors 164 and 165, the comparator 144 keeps a comparison result inactive (at L level); if there is a mismatch, the comparator sets the comparison result active (at H level). If both the enable signal EN and the valid signal VA_OUT are active, the AND circuit 145 outputs the comparison result output by the comparator 144 as an error detection signal ER as it is; if either the enable signal EN or the valid signal VA_OUT is inactive, the AND circuit sets the error detection signal ER inactive, irrespective of the comparison result output by the comparator 144.

And now, if the valid signal VA_OUT is active and only if the error detection signal ER is inactive, the receiving circuit 12 accepts the data D11 and D12 received from the bus bridge 13a as proper data. Otherwise, if the error detection signal ER is active, even though the valid signal VA_OUT is active, the receiving circuit 12 does not accept the data D11 and D12 received from the bus bridge 13a as proper data.

[Operation of the Semiconductor Device 1a]

Figure 3:
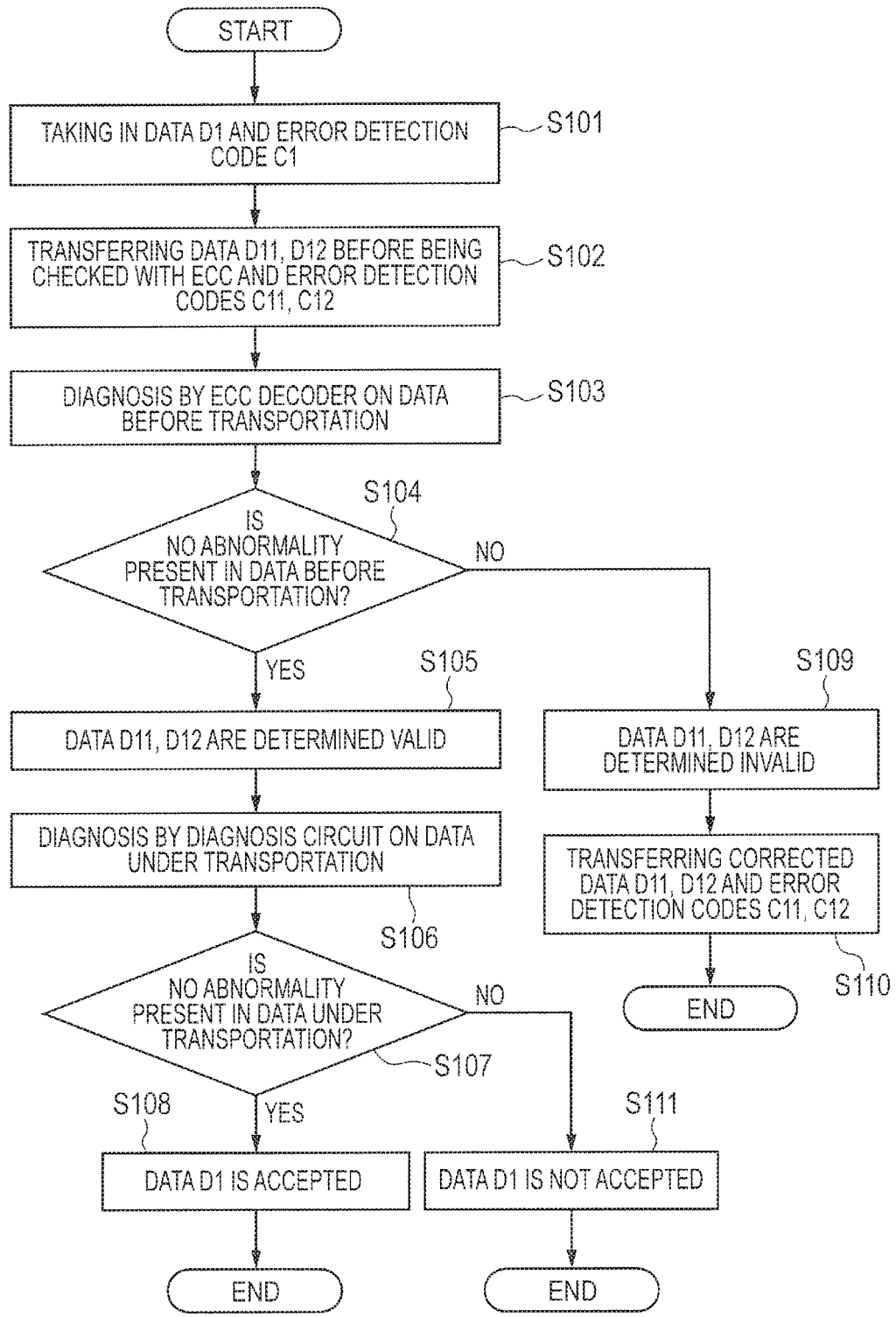
FIG. 3 is a flowchart illustrating operation of the semiconductor device depicted in FIG. 2.

The following describes operation of the semiconductor device 1a by way of FIG. 3.

FIG. 3 is a flowchart illustrating operation of the semiconductor device 1a.

First, the register 161 takes in data D1 and its error detection code C1 from the transmitting circuit 11 in sync with a clock signal (step S101). Upon taking in the data D1 and error detection code C1 normally, the register 161 sets a valid signal VA active (at H level).

The selector 164 sequentially selects and outputs 128-bit wide pieces of data D11 and D12, generated by dividing the 256-bit wide data D1 taken in by the register 161 into two pieces of data. At the same time, the selector 165 sequentially selects and outputs data D1 [255:128] composed of high-order 128 bits and data D1 [127:0] composed of low-order 128 bits in the data D1 taken in by the register 161.

The ECC encoder 132 sequentially generates 9-bit wide error detection codes C11 and C12 for each of the 128-bit wide data D11 and D12 which were sequentially output from the selector 164.

The data D11 and D12 before being checked with ECC, which were sequentially output from the selector 164, are sequentially transferred to the receiving circuit 12. The error detection codes C11 and C12 generated by the ECC encoder 132 are also sequentially transferred to the receiving circuit 12 together with the data D11 and D12 (step S102).

In parallel with the data transfer to the receiving circuit 12, the ECC decoder 131 performs diagnosis on the data D1 before being transported by the bus bridge 13a (step S103).

Specifically, the ECC decoder 131 diagnoses whether or not an error occurs in the data D1 taken in by the register 161, using the error detection code C1 taken in by the register 161. For instance, if no error occurs in the data D1, the ECC decoder 131 outputs the data D1 as it is and sets the enable signal EN active (at H level). Otherwise, if an error occurs in the data D1, the ECC decoder 131 corrects the data D1 and then outputs it and, besides, sets the enable signal EN inactive (at L level). And now, if it is impossible to correct the data D1, the enable signal EN is fixed in an inactive state.

First, if it has been diagnosed by the ECC decoder 131 that an error occurs in the data D1 before being transported (NO at step S104), that is, if the enable signal EN has been set inactive by the ECC decoder 131, the valid signal VA_OUT is set inactive by the valid signal output unit 166. Thereby, the receiving circuit 12 determines that the data D11 and D12 received from the bus bridge 13a are invalid (step S109).

Subsequently, the selector 164 switches selection to divided pieces of data D11 and D12 of corrected data D1 which was taken in by the register 162 and sequentially outputs these pieces of data D11 and D12. The ECC encoder 132 sequentially generates 9-bit wide error detection codes C11 and C12 for each of 128-bit wide corrected data D11 and D12 which were sequentially output from the selector 164.

The corrected data D11 and D12 which were sequentially output from the selector 164 are sequentially transferred to the receiving circuit 12. The error detection codes C11 and C12 generated by the ECC encoder 132 are also transferred to the receiving circuit 12 together with the corrected data D11 and D12 (step S110).

In fact, if it has been diagnosed by the ECC decoder 131 that an error occurs in the data D1 before being transported, the data transferred concurrently with the diagnosis by the ECC decoder 131 is determined invalid at the receiving circuit 12 and, subsequently, the data D11 and D12 corrected by the ECC decoder 131 are transferred as valid data to the receiving circuit 12.

And now, at this time, the valid signal VA_OUT becomes inactive because the enable signal EN is inactive and, therefore, the diagnosis circuit 14a does not perform diagnosis on the data being transported by the bus bridge 13a. Thereby, the error detection signal ER output by the diagnosis circuit 14a is kept inactive.

Then, if it has been diagnosed by the ECC decoder 131 that no error occurs in the data D1 before being transported (YES at step S104), that is, if the enable signal EN has been set active by the ECC decoder 131, the valid signal VA_OUT is set active by the valid signal output unit 166. Thereby, the receiving circuit 12 determines that the data D11 and D12 received from the bus bridge 13a are valid (step S105).

Here, because the enable signal EN is active, the diagnosis circuit 14a performs diagnosis on the data being transported by the bus bridge 13a (step S106). Specifically, the diagnosis circuit 14a compares the data D11 and D12 before being checked with ECC which are sequentially output from the selector 164 and the pieces of data D1 [255:128] and D1 [127:0] from the register 161 which are sequentially output from the selector 165, respectively, thereby diagnosing whether or not an error occurs in the data being transported by the bus bridge 13a.

For instance, if it has been diagnosed by the diagnosis circuit 14a that an error occurs in the data under transportation (NO at step S107), that is, if the error detection signal ER has been set active by the diagnosis circuit 14a, the receiving circuit 12 does not accept received data D11 and D12 as proper data, irrespective of the value of the valid signal VA_OUT (step S111).

Otherwise, if it has been diagnosed by the diagnosis circuit 14a that no error occurs in the data under transportation (YES at step S107), that is, if the error detection signal ER has been set inactive by the diagnosis circuit 14a, the receiving circuit accepts received data D11 and D12 as proper data (step S108).

As will be appreciated from the foregoing, even when the semiconductor device 1a is applied, the semiconductor system SYS1 makes a comparison between the data D1 before being transported and the divided pieces of data D11 and D12 after being transported and diagnoses whether or not an error occurs in the data under transportation, only when no error exists in the data D1 before being transported by the bus bridge 13a, similarly to the case where the semiconductor device 1 is applied. Thereby, the semiconductor system SYS1 in which the semiconductor device 1a is applied does not need to be additionally equipped with an ECC decoder and an ECC encoder, so enabling it to restrain enlargement of circuit size, as compared with the case where duplicated bus bridges are simply employed.

Besides, the semiconductor device 1a concurrently performs a diagnosis by the ECC decoder 131 on the data D1 before being transported and data transportation by the bus bridge 13a from the transmitting circuit 11 to the receiving circuit 12. Only when it has been diagnosed by the ECC decoder 131 that an error occurs in the data D1 before being transported, the semiconductor device 1a invalidates the data that has already been transferred to the receiving circuit 12 and then newly transfers corrected data to the receiving circuit 12. Thereby, the semiconductor device 1a enables it to transport data from the transmitting circuit 11 to the receiving circuit 12 swiftly.

Second Embodiment

Figure 4:
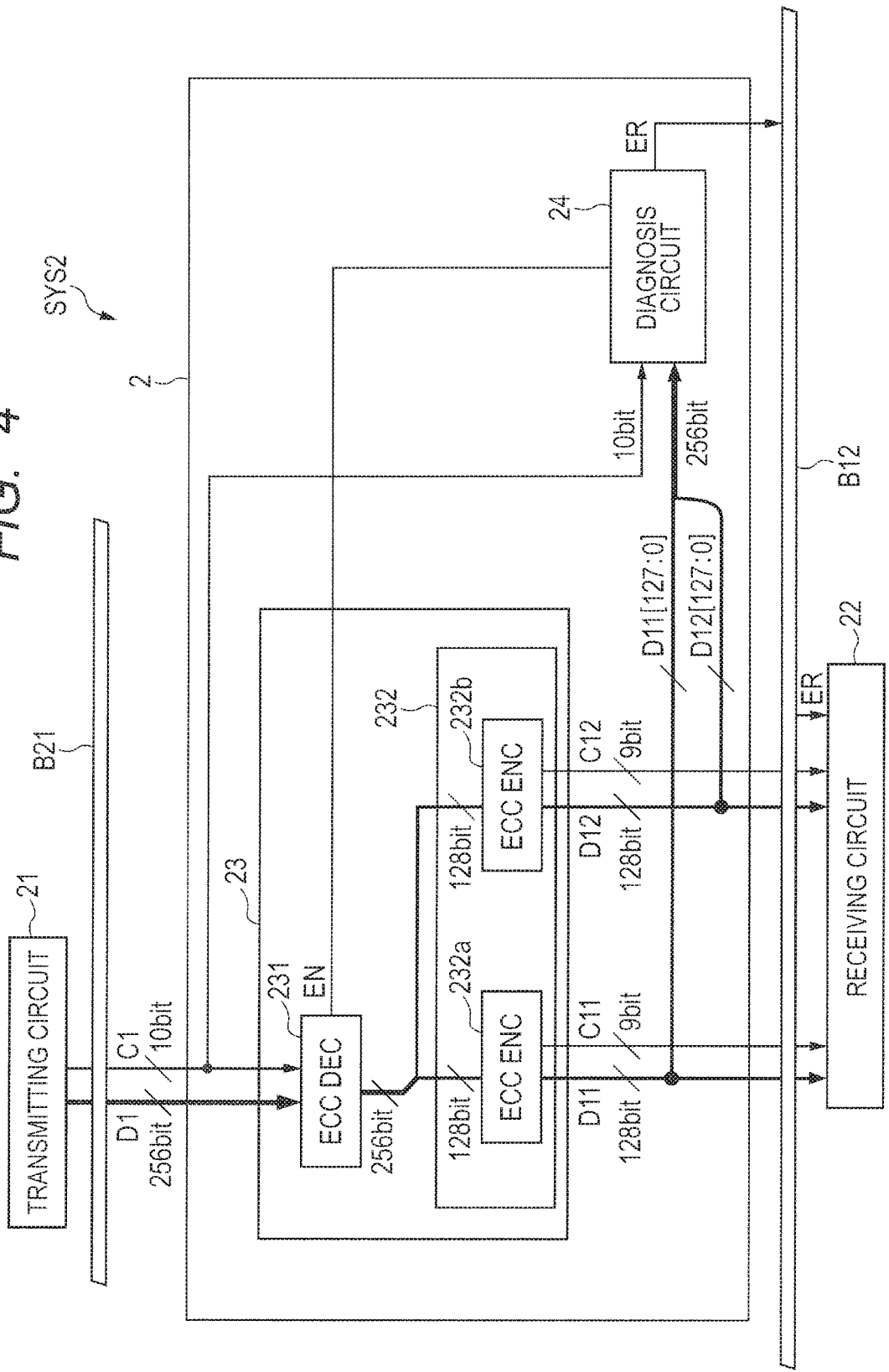
FIG. 4 is a diagram depicting a configuration example of a semiconductor system pertaining to a second embodiment.

FIG. 4 is a diagram depicting a configuration example of a semiconductor system SYS2 pertaining to a second embodiment. The semiconductor system SYS2 pertaining to the present embodiment diagnoses whether or not an error occurs in divided pieces of data D11 and D12 after being transported, using an error detection code 1 for data D1 before being transported by the bus bridge. Thereby, the semiconductor system SYS2 pertaining to the present embodiment enables it to improve a fault detection rate, while restraining enlargement of circuit size, as compared with a case where duplicated bus bridges are simply employed. This will be explained below specifically.

As depicted in FIG. 4, the semiconductor system SYS2 includes a transmitting circuit 21, a receiving circuit 22, a bus B21, a bus B22, a bus bridge 23, and a diagnosis circuit

24. And now, a semiconductor device 2 is comprised of the bus bridge 23 and the diagnosis circuit 24.

The transmitting circuit 21 transmits 256-bit wide data D1 and its 10-bit wide error detection code C1. The transmitting circuit 21 is, for example, a memory and outputs data D1 and its error detection code C1, stored in a storage area of the memory, in read mode. The data D1 and its error detection code C1 are supplied to the bus B21.

The bus bridge 23 performs transportation of data between the buses B21 and B22. For instance, the bus bridge 23 divides 256-bit wide data D1 supplied from the transmitting circuit 21 via the bus B21 into 128-bit wide pieces of data D11 and D12 which are fit for the bus width of the bus B22 and outputs these pieces of data sequentially to the bus B22. Also, the bus bridge 23 performs error detection for the data D1 using the error detection code C1 (and makes a correction, if possible) and, besides, generates 9-bit wide error detection codes C11 and C12 for each of the 128-bit wide pieces of data D11 and D12 and outputs these codes together with the data D11, D12 to the bus B22.

In the present embodiment, as an example, a case is described where data D11 corresponds to 128-bit wide data which is equivalent to high-order 128 bits in data D1 (i.e., data D1 [255:128]) and data D12 corresponds to 128-bit wide data which is equivalent to low-order 128 bits in data D1 (i.e., data D1 [127:0]).

Specifically, the bus bridge 23 includes an ECC decoder 231 and an ECC encoder 232. The ECC encoder 232 includes an ECC encoder 232*a* and an ECC encoder 232*b*. And now, the ECC encoders 232*a* and 232*b* may be used as a single common ECC encoder.

Using the error detection code C1 for data D1 transmitted from the transmitting circuit 21, the ECC decoder 231 diagnoses whether or not an error occurs in the data D1. For instance, if no error occurs in the data D1, the ECC decoder 231 outputs the data D1 as it is and sets an enable signal EN active (at H level). Otherwise, if an error occurs in the data D1, the ECC decoder 231 corrects the data D1 as much as possible and then outputs it and, besides, sets the enable signal EN inactive (at L level).

The ECC encoder 232*a* generates a 9-bit wide error detection code C11 for the 128-bit wide data D11 which is equivalent to the high-order 128 bits in the data D1. The ECC encoder 232*b* generates a 9-bit wide error detection code C12 for the 128-bit wide data D12 which is equivalent to the low-order 128 bits in the data D1. A combination of the data D11 and its error detection code C11 as well as a combination of the data D12 and its error detection code C12 are output sequentially to the bus B22.

The receiving circuit 22 is a circuit to receive data D11, D12 and their error detection codes C11, C12 supplied to the bus B22. The receiving circuit 22 is, for example, a CPU and receives the divided pieces of data D11 and D12 of data D1 transmitted from the transmitting circuit 21 and their error detection codes C11 and C12.

The diagnosis circuit 24 diagnoses whether or not an error occurs in data being transported by the bus bridge 23, only when no error occurs in the data D1 before being transported by the bus bridge 23 (when the enable signal EN is active). For instance, if an error occurs in the data under transportation, the diagnosis circuit 24 sets an error detection signal ER active (at H level); if not so, the diagnosis circuit sets the error detection signal ER inactive (at L level).

Specifically, the diagnosis circuit 24 has a circuit configuration that is similar to that of the ECC decoder 231. Here, the diagnosis circuit 24 diagnoses whether or not an error occurs in the divided pieces of data D11 and D12 after being transported, using the error detection code C1 for the data D1 before being transported by the bus bridge 23. If no error occurs in the data D11 and D12, the diagnosis circuit 24 sets an error detection signal ER inactive (at L level); if an error occurs in the data D11 and D12, the diagnosis circuit sets the error detection signal ER active (at H level).

As will be appreciated from the foregoing, the semiconductor system SYS2 pertaining to the present embodiment diagnoses whether or not an error occurs in the divided pieces of data D11 and D12 after being transported, using the error detection code C1 for the data D1 before being transported by the bus bridge 23. Thereby, the semiconductor system SYS2 pertaining to the present embodiment enables it to improve a fault detection rate, while restraining enlargement of circuit size, as compared with a case where duplicated bus bridges are simply employed. Because enlargement of circuit size can be restrained, it is possible to allow enough room for circuit layout and signal line wiring and, consequently, it is possible to facilitate designing to fulfill timing constraints.

And now, in comparison with the semiconductor system SYS1, the semiconductor system SYS2 does not need to be equipped with a comparator for making a comparison between two pieces of 256-bit wide data and, therefore, enables it to shrink circuit size more. On the other hand, the semiconductor system SYS1 makes a comparison between two pieces of 256-bit wide data instead of performing an ECC check and, therefore, enables it to improve a fault detection rate more.

In the present embodiment, as an example, a case where the bus bridge 23 divides data D1 into two 128-bit wide pieces of data D11 and D12 was described; however, no limitation to this is intended. The bus bridge 23 can be modified, as appropriate, to a configuration such that the bus bridge 23 divides data D1 into three or more pieces of data.

Besides, the configuration of the semiconductor device 2 which is comprised of the bus bridge 23 and the diagnosis circuit 24 is not limited to the configuration depicted in FIG. 4 and can be modified, as appropriate, without departing from the spirit of the invention.

As explained hereinbefore, the semiconductor system SYS1 pertaining to the foregoing first embodiment makes a comparison between data D1 before being transported and divided pieces of data D11 and D12 after being transported and diagnoses whether or not an error occurs in data under transportation, when no error exists in the data D1 before being transported by the bus bridge. Besides, the semiconductor system SYS2 pertaining to the foregoing second embodiment diagnoses whether or not an error occurs in data under transportation, using the error detection code C1 for the data D1 before being transported by the bus bridge. Thereby, the semiconductor systems SYS1, SYS2 pertaining to the foregoing first and second embodiments enable it to improve a fault detection rate, while restraining enlargement of circuit size, as compared with a case where duplicated bus bridges are simply employed.

While the invention developed by the present inventors has been described specifically based on its embodiments hereinbefore, it will be appreciated that the present invention is not limited to the embodiments described previously and various modifications may be made thereto without departing from the gist of the invention.

What is claimed is:

1. A semiconductor device comprising: an ECC (Error Correction Code) decoder which diagnoses whether or not an error occurs in data transmitted from a transmitting circuit, using an error detection code for the data; an ECC encoder which generates a first error detection code for a first divided piece of data equivalent to a bit range accounting for a part of plural bits configuring the data and generates a second error detection code for a second divided piece of data equivalent to a bit range accounting for a remaining part of the bits configuring the data; and a diagnosis circuit which, when no error in the data transmitted from the transmitting circuit has been detected by the ECC decoder, compares a part of the data corresponding to the first divided piece of data with the first divided piece of data used in generating the first error detection code in the ECC encoder and compares a part of the data corresponding to the second divided piece of data with the second divided piece of data used in generating the second error detection code in the ECC encoder, and generates an error detection signal to detect an error in the first and second divided piece of data used in generating the first and second error detection code respectively when there is a data mismatch, wherein the diagnosis circuit does not perform the comparison when the ECC decoder detects the data having a correctable error.

2. The semiconductor device according to claim 1, wherein the ECC encoder is configured to output any one of a combination of the first divided piece of data and the first error detection code and a combination of the second divided piece of data and the second error detection code, and successively output the other combination.

3. The semiconductor device according to claim 1, wherein the ECC encoder comprises:
a first ECC encoder which outputs the first divided piece of data and the first error detection code; and
a second ECC encoder which outputs the second divided piece of data and the second error detection code.

4. A semiconductor system comprising:
a transmitting circuit which transmits the data;
the semiconductor device, as described in claim 1, which generates the first and the second divided pieces of data by dividing the data transmitted from the transmitting circuit into these pieces and generates the first and the second error detection codes for the first and the second divided pieces of data, respectively; and
a receiving circuit which receives the first and the second divided pieces of data and the first and the second error detection codes.

5. A semiconductor device comprising:
an ECC (Error Correction Code) decoder which diagnoses whether or not an error occurs in data transmitted from a transmitting circuit, using an error detection code for the data;
an ECC encoder which generates a first error detection code for a first divided piece of data equivalent to a bit range accounting for a part of plural bits configuring the data and generates a second error detection code for a second divided piece of data equivalent to a bit range accounting for a remaining part of the bits configuring the data; and
a diagnosis circuit which diagnoses whether or not an error occurs in each of the first divided piece of data used in generating the first error detection code in the ECC encoder and the second divided piece of data used in generating the second error detection code in the ECC encoder, by applying the error detection code for the data to combined data of the first divided piece of data and the second divided piece of data.

6. The semiconductor device according to claim 5, wherein the diagnosis circuit is configured to perform diagnosis only when no error in the data has been detected by the ECC decoder.

7. The semiconductor device according to claim 5, wherein the diagnosis circuit comprises the same circuit configuration as that of the ECC decoder.

8. The semiconductor device according to claim 5, wherein the ECC encoder is configured to output any one of a combination of the first divided piece of data and the first error detection code and a combination of the second divided piece of data and the second error detection code and successively output the other combination.

9. The semiconductor device according to claim 5, wherein the ECC encoder comprises:
a first ECC encoder which outputs the first divided piece of data and the first error detection code; and
a second ECC encoder which outputs the second divided piece of data and the second error detection code.

10. A semiconductor system comprising:
a transmitting circuit which transmits the data;
the semiconductor device, as described in claim 5, which generates the first and the second divided pieces of data by dividing the data transmitted from the transmitting circuit into the pieces and generates the first and the second error detection codes for the first and the second divided pieces of data, respectively; and
a receiving circuit which receives the first and the second divided pieces of data and the first and the second error detection codes.

* * * * *